United States Patent
Kim et al.

(10) Patent No.: US 9,342,120 B2
(45) Date of Patent: May 17, 2016

(54) MOUNTING STRUCTURE AND METHOD FOR DISSIPATING HEAT FROM A COMPUTER EXPANSION CARD

(71) Applicant: OCZ Storage Solutions Inc., San Jose, CA (US)

(72) Inventors: Dokyun Kim, Fremont, CA (US); Karl Reinke, Santa Clara, CA (US)

(73) Assignee: Toshiba Corporation, Tokyo (JP)

( * ) Notice: Subject to any disclaimer, the term of this patent is extended or adjusted under 35 U.S.C. 154(b) by 0 days.

(21) Appl. No.: 14/458,614

(22) Filed: Aug. 13, 2014

(65) Prior Publication Data
US 2014/0362524 A1 Dec. 11, 2014

Related U.S. Application Data

(62) Division of application No. 13/339,413, filed on Dec. 29, 2011, now Pat. No. 8,885,336.

(60) Provisional application No. 61/427,867, filed on Dec. 29, 2010.

(51) Int. Cl.
| | |
|---|---|
| *H05K 7/20* | (2006.01) |
| *G06F 1/20* | (2006.01) |
| *F28D 15/02* | (2006.01) |
| *G06F 1/18* | (2006.01) |
| *H01L 23/427* | (2006.01) |
| *H05K 5/02* | (2006.01) |
| *H05K 7/14* | (2006.01) |

(52) U.S. Cl.
CPC *G06F 1/20* (2013.01); *F28D 15/02* (2013.01); *G06F 1/185* (2013.01); *H01L 23/427* (2013.01); *H05K 5/0213* (2013.01); *H05K 7/1417* (2013.01); *G06F 2200/201* (2013.01); *H01L 2924/0002* (2013.01); *Y10T 29/49002* (2015.01); *Y10T 29/49004* (2015.01); *Y10T 29/49826* (2015.01)

(58) Field of Classification Search
CPC ........... G06F 1/185; G06F 1/186; G06F 1/20; H05K 7/2029; H05K 7/20336; H05K 7/208; H05K 7/20809
See application file for complete search history.

(56) References Cited

U.S. PATENT DOCUMENTS

| | | | |
|---|---|---|---|
| 6,717,811 B2 * | 4/2004 | Lo | G06F 1/20 165/104.33 |
| 6,754,077 B2 * | 6/2004 | Lo | H05K 7/20318 165/104.33 |
| 7,177,154 B2 * | 2/2007 | Lee | G06F 1/181 165/104.33 |
| 7,382,616 B2 * | 6/2008 | Stefanoski | G06F 1/20 165/104.33 |
| 7,495,923 B2 * | 2/2009 | Peng | G06F 1/20 165/104.33 |
| 7,800,906 B2 * | 9/2010 | Chang | G06F 1/20 165/104.26 |
| 7,852,632 B2 * | 12/2010 | Chu | F28D 15/0266 165/104.33 |

(Continued)

*Primary Examiner* — Robert J Hoffberg
(74) *Attorney, Agent, or Firm* — White & Case LLP

(57) ABSTRACT

A mounting structure adapted for mounting an expansion card within a computer enclosure and configured to directly absorb and conduct heat from a heat source (such as an IC chip) on the card to the ambient atmosphere surrounding the enclosure. The mounting structure includes a mounting bracket, a heat sink adapted to contact a surface of the heat source on the expansion card, an extension interconnecting the heat sink and the mounting bracket, one or more features for conducting heat from the heat sink to the mounting bracket, and one or more features associated with the mounting bracket for dissipating heat from the mounting structure to the ambient atmosphere surrounding the enclosure.

14 Claims, 7 Drawing Sheets

(56) References Cited

U.S. PATENT DOCUMENTS

| | | | | |
|---|---|---|---|---|
| 7,885,073 B2* | 2/2011 | Peng | ................. | H01L 23/427 165/104.33 |
| 8,885,336 B2* | 11/2014 | Kim | ................. | F28D 15/02 165/185 |
| 2015/0355691 A1* | 12/2015 | Kim | ................. | F28D 15/02 361/679.54 |

* cited by examiner

MOUNTING STRUCTURE AND METHOD FOR DISSIPATING HEAT FROM A COMPUTER EXPANSION CARD

CROSS REFERENCE TO RELATED APPLICATIONS

This is a division patent application of co-pending U.S. patent application Ser. No. 13/339,413, filed Dec. 29, 2011, which claims the benefit of U.S. Provisional Application No. 61/427,867 filed Dec. 29, 2010, the contents of which are incorporated herein by reference.

BACKGROUND OF THE INVENTION

The present invention generally relates to expansion cards adapted for use in host computer systems, including personal computers and servers. More particularly, the invention relates to thermal management of integrated circuit (IC) chips on expansion cards and the use of an extension of a mounting bracket to absorb and dissipate heat generated by IC chips to the environment outside a computer enclosure.

Power consumption and thermal dissipation of IC chips used in computer systems, including but not limited to personal computers and servers, has reached a threshold where the off-loading of heat to the environment has become a significant challenge in the operation and maintenance of the system infrastructure. In most instances, thermal management involves passive heat transfer techniques that utilize a heat sink or active heat transfer techniques that utilize combinations of heat sinks and forced convection (for example, fans) to absorb heat from a surface of an IC chip and then dissipate the thermal load into the surrounding environment through another surface that is typically larger and faces away from the IC chip.

The dissipation of heat into the environment is generally determined by the temperature differential between the dissipation surface and the environment and the properties of the coolant, which in most cases is a fluid (liquids and/or gases). The ambient temperature inside a computer enclosure is typically substantially above that of the ambient atmosphere surrounding the enclosure. Consequently, the temperature differential between the IC chip/heat sink and the environment within the enclosure is less than the temperature differential between the IC chip/heat sink and the ambient atmosphere outside the enclosure. More or less elaborate ventilation systems installed in computer enclosures, such as exhaust fans, are generally part of the specifications of computer form factors. For example, part of the ATX specifications defines the airflow within a computer system. Other methods to improve cooling efficiency include direct exhaust designs of expansion cards, which typically require an increase in height to a dual slot form factor in order to accommodate the exhaust vents. In addition, specialized exhaust fan solutions have been available that occupy any vacant slot in the rear of the computer enclosure and are typically mounted directly adjacent to a heat source in order to maximize removal of hot air.

All solutions mentioned above have the drawback of increased cost and potential failure of moving parts. Therefore, a highly desirable solution would entail a more direct and passive conductance of thermal energy from a heat source within a computer enclosure to the ambient atmosphere outside the enclosure.

BRIEF DESCRIPTION OF THE INVENTION

The present invention discloses a mounting structure adapted for mounting an expansion card within a computer enclosure and configured to directly absorb and conduct heat from a heat source (such as an IC chip) on the card to the ambient atmosphere surrounding the enclosure.

According to one aspect of the invention, the mounting structure includes a mounting bracket, means for securing the mounting bracket to the enclosure, a heat sink adapted to contact a surface of the heat source on the expansion card, an extension interconnecting the heat sink and the mounting bracket, means for conducting heat from the heat sink to the mounting bracket, and means associated with the mounting bracket for dissipating heat from the mounting structure to the ambient atmosphere surrounding the enclosure.

According to a second aspect of the invention, a computer system is provided that has an enclosure in which an expansion card is mounted with a mounting structure comprising the elements described above.

According to a third aspect of the invention, a method is provided for mounting an expansion card within a computer enclosure and for absorbing and conducting heat from a heat source on the expansion card to an ambient atmosphere surrounding the enclosure. The method includes securing the expansion card to the mounting bracket so that a heat sink extending from the mounting bracket contacts a surface of the heat source, securing the mounting bracket to the enclosure, conducting heat from the heat sink to the mounting bracket, and dissipating heat from the mounting structure to the ambient atmosphere surrounding the enclosure.

According to particular aspects of the invention, heat transfer from the heat sink to the mounting bracket can be by thermal conductance alone, and/or through a heat pipe or vapor chamber that contains a phase change material.

A technical effect of the invention is the ability to use a mounting bracket to assist in the conduction of heat from IC chips mounted on an expansion card that is mounted within an enclosure by the bracket. The heat transfer capability is not dependent on the use of moving parts that could wear out or malfunction. Instead, embodiments of the invention can rely on unitary structures or assemblies that are capable of relying solely on thermal conductance, heat pipes, and/or other phase-change technologies to conduct heat to the exterior of an enclosure.

Other aspects and advantages of the invention will be better appreciated from the following detailed description.

BRIEF DESCRIPTION OF THE DRAWINGS

FIG. 3d schematically represents an isolated view of the combined mounting bracket, extension, heat sink, heat pipes and fins of FIG. 3a.

DETAILED DESCRIPTION OF THE INVENTION

Figure 1B:
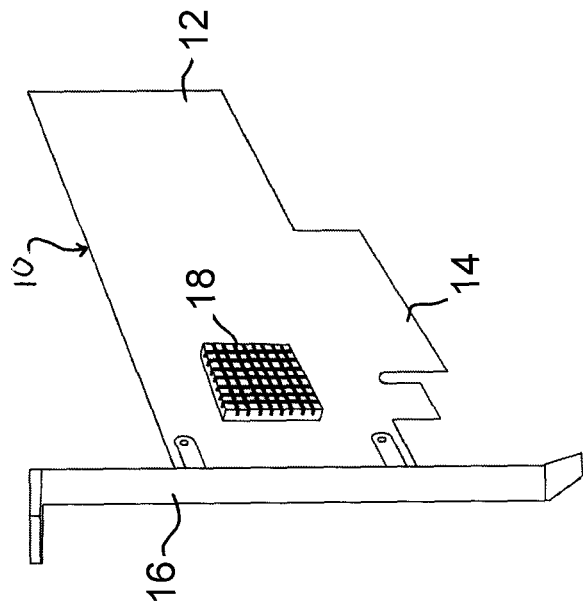
FIGS. 1a and 1b schematically represent two views of a PCIe expansion card secured to a mounting bracket and equipped with a heat sink for conducting heat away from an IC chip on the card in accordance with conventional practices in the prior art.
Figure 1A:
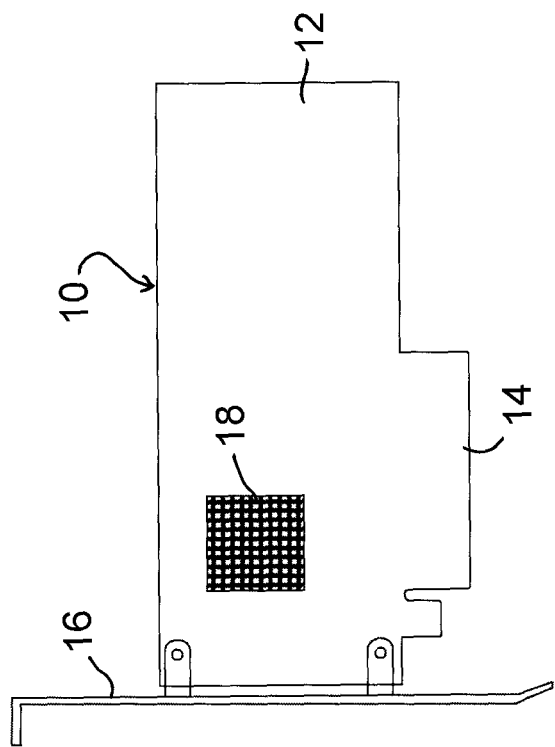

FIGS. 1a and 1b schematically illustrate a prior art expansion (carrier) card 10 configured to be installed in a host system (not shown), for example, a personal computer or server. The card 10 includes a printed circuit board (PCB) 12 on which various electrical components, including IC chips (not shown), can be mounted. While the term "card" will be used in the following discussion, it should be understood that the term encompasses various other physical forms of devices that comprise IC chips mounted on a substrate. For use in the currently prevailing system architecture, the card 10 is represented as being configured to use what is currently the most common system bus interface, the peripheral component interconnect express (PCI express or PCIe) interface, though other system bus interfaces could be utilized by the card 10. The card 10 is represented as being equipped with a system interface in the form of a PCIe edge connector 14 configured for interfacing with a host system. The connector 14 may, for example, plug into a PCIe socket on a motherboard. The card 10 is further represented in FIGS. 1a and 1b as secured to a mounting (retention) bracket 16 adapted to mount the card 10 within an enclosure of a host system, and a heat sink 18 that contacts a surface of an IC chip (not shown) mounted on the PCB 12 for the purpose of absorbing heat from the IC chip and conducting the absorbed heat away from the chip.

The current invention is directed to solving thermal problems in expansion cards, including the card 10 represented in FIGS. 1a and 1b, and in particular cards on which IC chips are mounted that generate significant amounts of heat, for example, controller IC chips with medium power consumption. In this context, medium power consumption will be defined as ranging from approximately 1 W to approximately 15 W and resulting in a power density of approximately 1 to 5 W/cm$^2$. Most contemporary computer systems follow the ATX form factor specifications and by extension use an upright or tower configuration. In this configuration, the PCB 12 of the expansion card 10 of FIGS. 1a and 1b would be typically oriented horizontally with its active components (including IC chips) facing downwards. Because heated air rises, this orientation is not optimal for heat dissipation in that heat generated by any IC chip on the card 10 has a tendency to be trapped underneath the PCB 12. In addition to trapping heated air beneath the PCB 12, the temperature within an enclosure that houses the card 10 is often about 40° C. to about 65° C. higher than the ambient atmosphere surrounding the enclosure, which significantly decreases the temperature delta between a heat source (IC chip) and the environment within the enclosure.

Standard solutions employed to counter the problem of trapped heat include augmenting heat transfer to the environment within the enclosure by directing air flow toward the heat sink 18. Additional methods include the use of an active cooling device mounted on the card 10, for example, an integrated fan that moves air over the heat sink 18. Alternatively, the card 10 can be equipped with air ducts and vents located in the mounting bracket 16, through which cooler air from outside the enclosure is drawn by an exhaust fan of the enclosure. Another variation uses similar ducts in combination with a fan to create an active exhaust system in which the heat dissipated by the IC chip is expelled from the enclosure using the case air as the cooling medium. Aside from creating airflow over the heat source and/or associated heat sink 18, the expulsion of hot air from the enclosure reduces the temperature of the environment within the enclosure and, by extension, the cooling efficiency of the design.

Each of the solutions outlined above have the disadvantage of either being inefficient or relying on the use of moving parts, with the inherent problem of mechanical failure due to dust and/or clogging of air flow passages. As a solution, the present invention seeks to conduct heat away from an IC chip on an expansion card to the exterior of an enclosure using as few moving parts as possible, while providing an efficient solution adaptable to a variety of power and heat envelopes of IC chips, including the above-noted IC chips with medium power consumption.

Figure 2B:
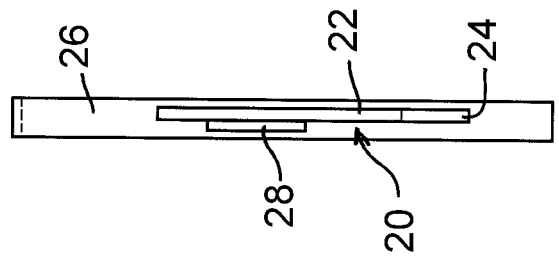
FIGS. 2a, 2b and 2c schematically represent top, end and perspective views, respectively, of a PCIe expansion card configured in accordance with an embodiment of the invention, wherein the card is secured to a combined mounting bracket, extension and heat sink to absorb and conduct heat from an IC chip on the card.
Figure 2A:
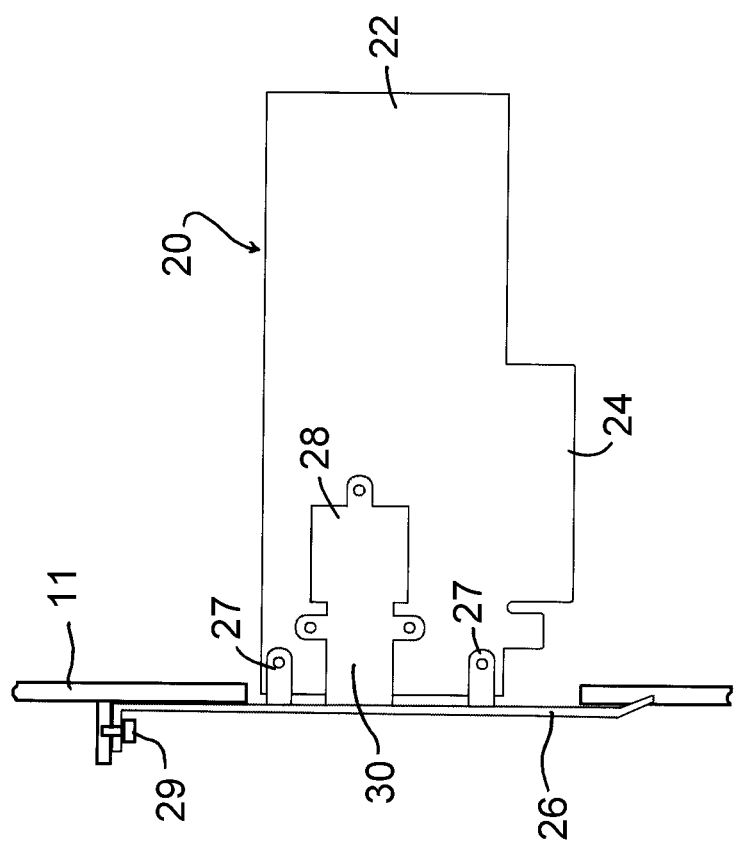
Figure 2D:
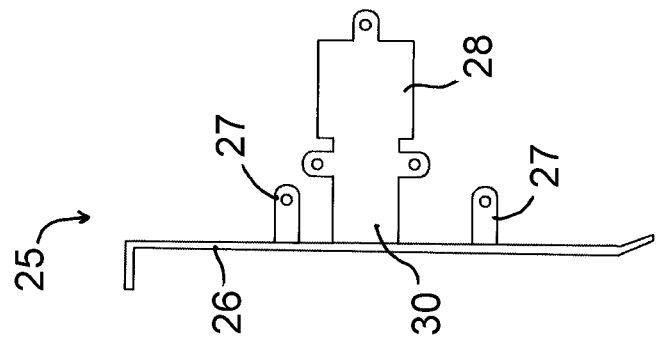
FIG. 2d schematically represents an isolated view of the combined mounting bracket, extension and heat sink of FIGS. 2a-c.
Figure 2C:
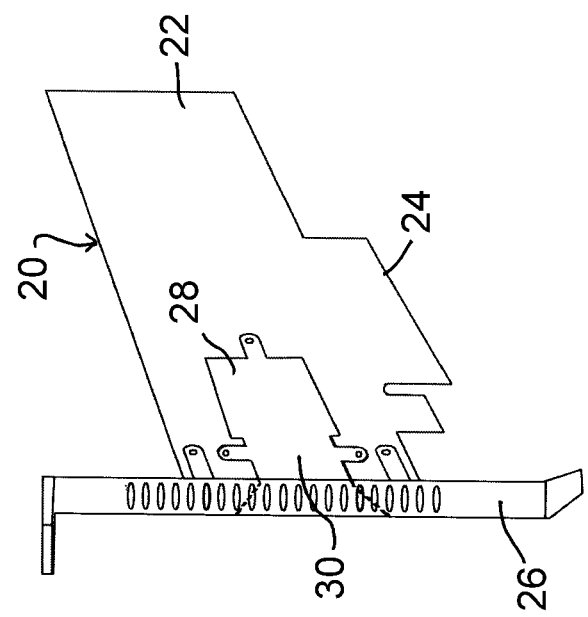

In one aspect of the invention, FIGS. 2a, 2b and 2c schematically represent an expansion (carrier) card 20 comprising a PCB 22 and edge connector 24, as well as a mounting bracket 26 to which the PCB 22 is mounted with flanges 27. As with conventional mounting brackets for expansion cards, the bracket 26 is configured for mounting the card 20 within an enclosure 11 of a host system, for example, with the use of one or more screws 29, tabs or other suitable fastening means capable of securing the bracket 26 to the enclosure 11. The bracket 26 further comprises a monolithic heat sink 28 that is interconnected to the bracket 26 by an extension 30, so that heat can be conducted directly to the bracket 26 from an IC chip (not shown) on the card 20 contacted by the heat sink 28. To promote heat transfer to the bracket 26, the bracket 26, heat sink 28 and extension 30 are preferably manufactured from a material that exhibits high thermal conductivity (preferably at least 120 W/mK), for example, copper, aluminum, etc. Furthermore, heat conduction between the heat sink 28 and bracket 26 is promoted by preferably fabricating the heat sink 28 and extension 30 as a seamless extension of the bracket 26, in other words, the bracket 26, extension 30 and heat sink 28 are fabricated as a unitary mounting structure 25 (FIG. 2d), and as such are not assembled together and therefore lack any discontinuities that would result from an assembly comprising components whose surfaces contact each other.

The heat sink 28 and extension 30 are preferably planar in shape and lie in a plane parallel to the PCB 22 of the card 20 (FIG. 2b), so as to form a low profile for mounting in the enclosure 11. The cross-sectional area of the extension 30 should be sufficiently large relative to the heat sink 28 to minimize the resistance to thermal conduction away from the heat sink 28 to the bracket 26. For example, the cross-sectional area of the extension is preferably at least one-half the cross-sectional area of the heat sink 28. The relatively large cross-sectional area of the bracket 26 transverse to the direction of heat transfer (as evident in FIG. 2b) promotes the ability of the bracket 26 to dissipate heat into the ambient atmosphere surrounding an enclosure 11 in which the card 20 is installed, and therefore under conditions in which a greater thermal differential exists between the bracket 26 and the ambient atmosphere than exists between the heat sink 28 and the environment within the enclosure 11. Heat dissipation is further augmented by mechanical contact between the bracket 26 and enclosure 11, in that the latter is able to absorb heat from the bracket 26.

Figure 3A:
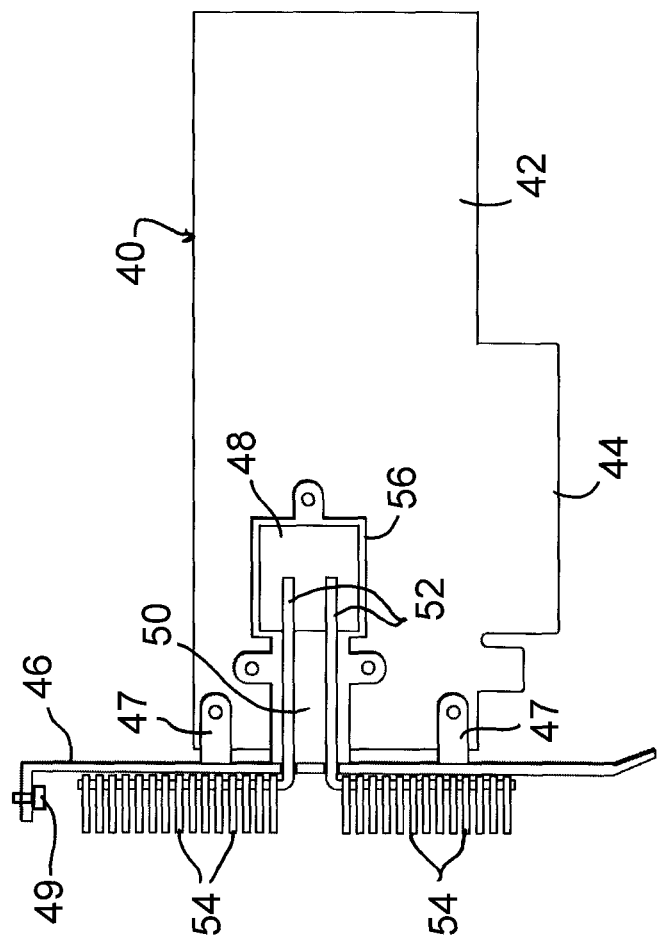
FIG. 3a schematically represents a PCIe expansion card configured in accordance with another embodiment of the invention, wherein the card is secured to a combined mounting bracket, extension, heat sink, heat pipes and fins that cooperate to absorb and conduct heat from an IC chip on the card to an ambient atmosphere.
Figure 3C:
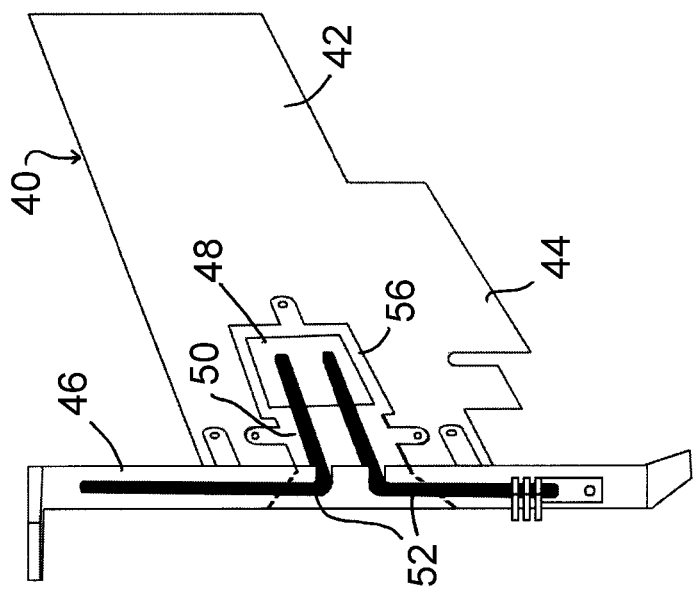
FIG. 3c schematically represents a perspective view of the card of FIG. 3a, but omits most of the fins to better illustrate the relation of the mounting bracket, extension, heat sink and heat pipes.
Figure 3B:
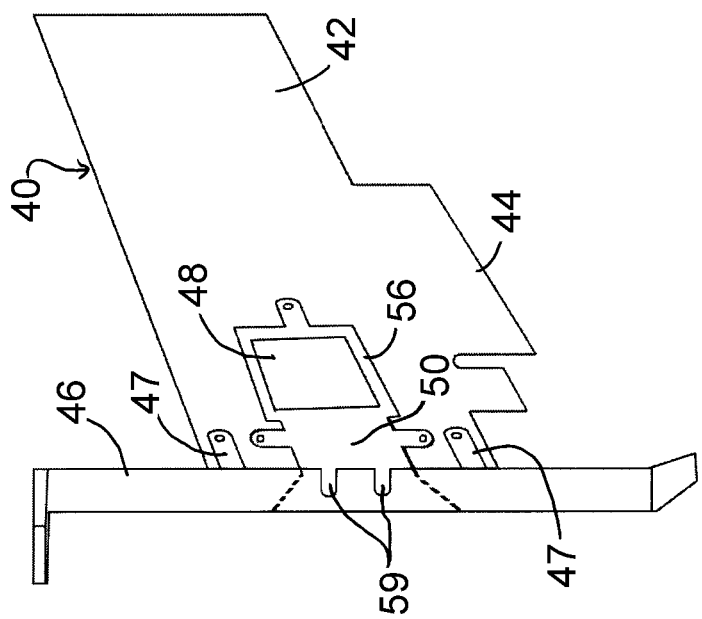
FIG. 3b schematically represents a perspective view of the card of FIG. 3a, but omits the heat sink, heat pipes and fins so as to show only the mounting bracket and extension.

In a second aspect of the invention, FIGS. 3a, 3b and 3c schematically represent an expansion card 40 comprising a PCB 42 and an edge connector 44, a mounting bracket 46 to which the PCB 42 is mounted with flanges 47, and a heat sink 48 interconnected to the bracket 46 by an extension 50. As with the bracket 26 of FIGS. 2a-d, the bracket 46 is configured for mounting the card 40 within an enclosure (not shown) of a host system, for example, with the use of one or more screws 49, tabs or other suitable fastening means. Relative to the embodiment of FIGS. 2a-d, FIGS. 3a-c represent an enhanced design that incorporates a heat pipe 52 and fins 54 for better thermal conductance of heat away from an IC chip (not shown) contacted by the heat sink 48 to the ambient atmosphere outside an enclosure in which the card 40 is installed.

Figure 3E:
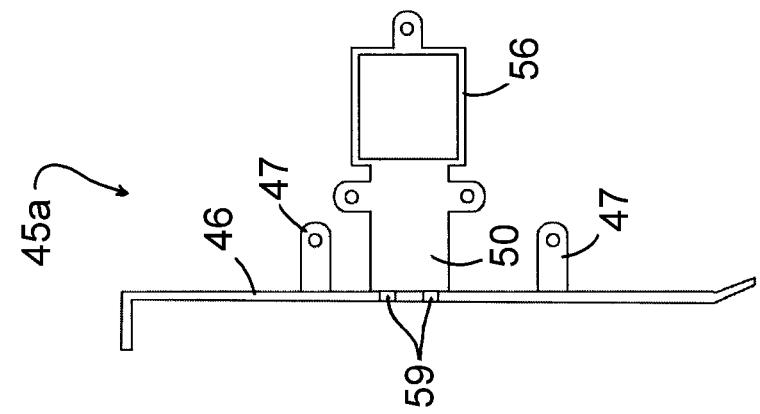
FIG. 3e schematically represents an isolated view similar to FIG. 3d, but omits the heat sink, heat pipes and fins so as to shown only the mounting bracket and extension.
Figure 3D:
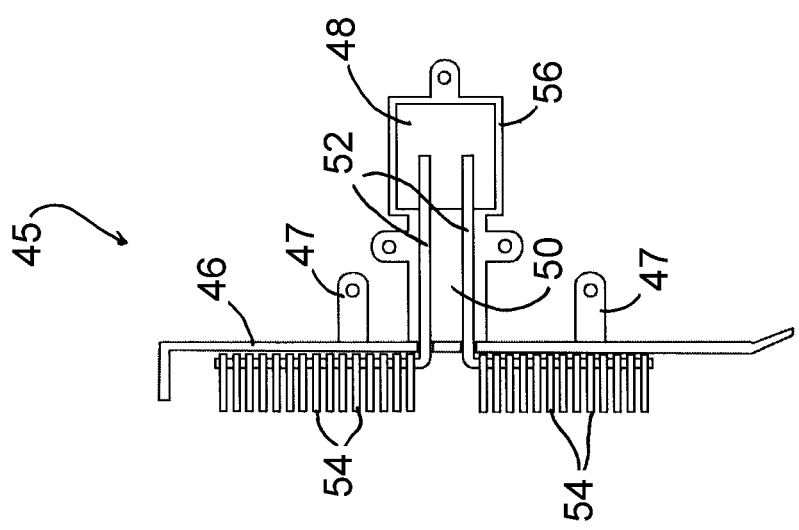

In contrast to the embodiment of FIGS. 2a-d, the bracket 46, extension 50 and heat sink 48 are fabricated as parts of sub-structures 45a and 45b (FIGS. 3e and 3f) that are assembled together to form an integrated mounting structure 45 (FIG. 3d). As such, the bracket 46 can be separately fabricated from the heat sink 48 using conventional materials (for example, steel) in order to promote mechanical integrity and stability. Furthermore, the extension 50 can be fabricated as an integral portion of the bracket 46, to which the heat sink 48 may be mounted. As such, the heat sink 48 may be separately fabricated from a more conductive material (for example, copper, aluminum, etc.) than the bracket 46 and extension 50.

Figure 3F:
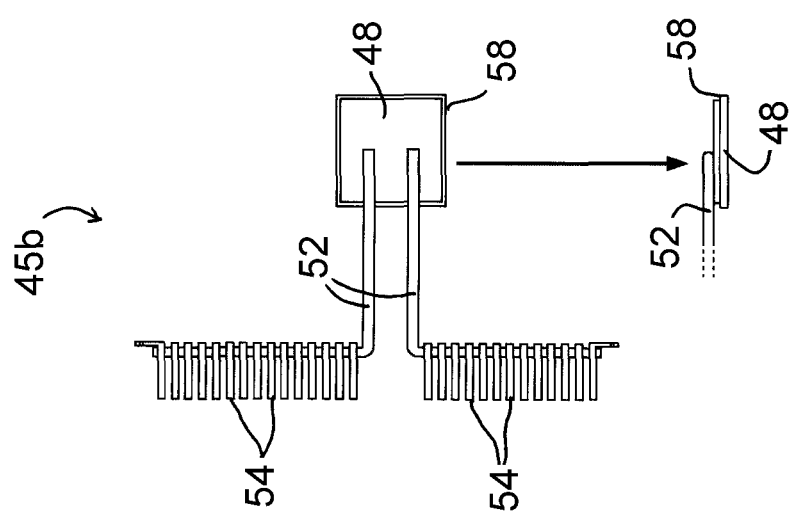
FIG. 3f schematically represents an isolated view similar to FIG. 3d, but omits the mounting bracket and extension so as to show only the heat sink, heat pipes and fins.

Another feature of this configuration is that the extension 50 can be formed to comprise a frame 56 within which the heat sink 48 can be inserted, such that the frame 56 surrounds the heat sink 48. With this configuration, the heat sink 48 and frame 56 can be equipped with means for biasing the heat sink 48 into contact with an IC chip. As an example, FIG. 3f represents the heat sink 48 as being configured to have a recessed edge 58 or other stepped feature against which a compressible material, spring-loaded screws, or other means (not shown) mounted to the frame 56 can bias the heat sink 48 into better thermal contact with an IC chip. With or without the inclusion of a biasing means, the recessed edge 58 of the heat sink 48 is preferably sized relative to the frame 56 so that the heat sink 48 can be placed in the frame 56 and, as a result of mounting the bracket 46 to the enclosure, the heat sink 48 will be held by the frame 56 in contact with an IC chip.

The heat pipes 52 can be configured to operate in a manner similar to heat pipe technologies used as cooling solutions for central processors (CPU), graphics processors (GPU), and other high power density electronics. As such, the heat pipes 52 define enclosed volumes that are filled with water or another suitable coolant under partial vacuum conditions. The partial vacuum within the pipes 52 can be selected to lower the boiling point of the coolant to a desired temperature. At the locations within the pipes 52 adjacent the heat sink 48, the coolant boils and, in the process of changing from the liquid to the gaseous (vapor) phase, absorbs heat energy from the heat sink 48. The resultant vapor condenses at the remote end of each pipe 52 contacted by the fins 54, with the result that heat is transferred to the fins 54 disposed on a side of the mounting bracket 46 opposite the heat sink 48. The evaporation and condensation processes are phase change and as such are able to consume and release thermal energy, respectively.

As evident from FIG. 3f, the heat sink 48, heat pipes 52 and fins 54 can be fabricated to define a unitary structure 45b, in which the heat pipes 52 are soldered or furnace-brazed to the heat sink 48 and to the fins 54. As evident from FIGS. 3a-e, the heat pipes 52 extend through openings 59 in the bracket 46 so that the fins 54 will be located outside of an enclosure in which the card 40 is mounted by the bracket 46, and therefore the fins 54 are able to conduct the absorbed heat directly to the ambient atmosphere outside the enclosure. The unitary structure 45b formed by the heat sink 48, heat pipes 52 and fins 54 can be secured to a unitary structure 45a (FIG. 3e) formed by the bracket 46, extension 50 and frame 56 via the frame 56 and recessed edge 58 of the heat sink 48. The fins 54 at the opposite end of the unitary structure 45b can be secured to the bracket 46 with fasteners, for example, screws, rivets, etc.

Figure 4:
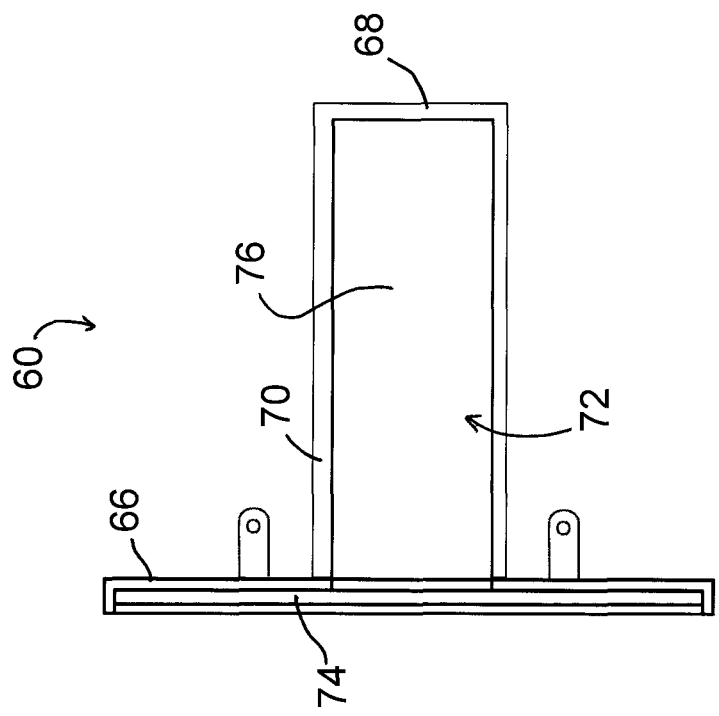
FIG. 4 schematically represents a combined mounting bracket, extension and heat sink that cooperate to define a vapor chamber adapted to absorb and conduct heat from an IC chip on an expansion card to an ambient atmosphere.

In a third aspect of the invention, FIG. 4 schematically represents an integrated mounting structure 60 that can be used to mount an expansion card, for example, a card of the types represented in any of the preceding figures, within an enclosure (not shown). The assembly 60 includes a bracket portion 66, a heat sink portion 68, and an extension portion 70 that interconnects the bracket and heat sink portions 66 and 68. For purposes of illustration, the assembly 60 is shown in FIG. 4 as having an outer wall removed to expose an internal vapor chamber 72 defined by two connected cavities 74 and 76, which are defined within the bracket and heat sink portions 66 and 68, respectively, of the assembly 60, as well as the extension portion 70 therebetween. Similar to the heat pipes 52 of the previous embodiment, the vapor chamber 72 contains a small amount of water or other coolant in a low pressure environment to induce vapor formation at a predictable temperature within the cavity 76 of the heat sink portion 68 of the assembly 60, which is intended to physically contact or otherwise be in close thermal contact with an IC chip. Thereafter, the vapor condenses within the cavity 74 of the bracket portion 66, which is located at the opposite end of the assembly 60 and is configured to protrude outside of the enclosure to which the expansion card (not shown) is mounted. The bracket portion 66 of the assembly 60 is configured to serve as a mounting bracket by which the assembly 60 and a card mounted thereto can be secured to an enclosure.

In view of the above, it should be appreciated that each of the embodiments described above and shown in FIGS. 2a-d, 3a-f and 4 enables a mounting bracket for an expansion card to serve as a heat transfer device for one or more IC chips mounted on the card. The bracket can be part of a monolithic structure or part of an assembly, and provides mechanical support for means that absorbs heat from an IC chip, conducts the absorbed heat through the bracket, and then dissipates the absorbed heat into the ambient atmosphere surrounding the exterior of an enclosure in which the card is mounted.

While the invention has been described in terms of specific embodiments, it is apparent that other forms could be adopted by one skilled in the art. Accordingly, it should be understood that the invention is not limited to embodiments illustrated in the Figures. It should also be understood that the phraseology and terminology employed above are for the purpose of disclosing the illustrated embodiments, and do not necessarily serve as limitations to the scope of the invention. Therefore, the scope of the invention is to be limited only by the following claims.

The invention claimed is:

1. A mounting structure configured for mounting an expansion card within a computer enclosure and for absorbing and conducting heat from a heat source on the expansion card to an ambient atmosphere surrounding the computer enclosure, the mounting structure comprising:
   a mounting bracket configured to support the expansion card within the computer enclosure;
   a means for securing the mounting bracket to the computer enclosure;
   a heat sink adapted to contact a surface of the heat source on the expansion card;
   an extension interconnecting the heat sink and the mounting bracket; and
   a means for conducting the heat from the heat sink to the mounting bracket and then dissipating the heat from the mounting bracket to the ambient atmosphere surrounding an exterior of the computer enclosure by a phase change medium within at least one heat pipe that contacts the heat sink and the mounting bracket of the mounting structure.

2. The mounting structure of claim 1, wherein the mounting structure is an assembled structure in which the heat sink is assembled with the extension and the mounting bracket.

3. The mounting structure of claim 1, wherein the heat sink is received within a frame defined by the extension.

4. The mounting structure of claim 3, further comprising a means for biasing the heat sink away from the frame.

5. The mounting structure of claim 1, wherein the means for conducting the heat from the heat sink to the mounting bracket and then dissipating the heat to the ambient atmosphere further comprises fins contacting the at least one heat pipe and disposed on a side of the mounting bracket opposite the heat sink.

6. The mounting structure of claim 5, wherein the heat is transferred from the heat sink to the fins by the phase change medium within the at least one heat pipe.

7. The mounting structure of claim 1, wherein the heat sink and the extension are oriented so as to be substantially parallel to the expansion card when the expansion card is mounted to the mounting structure.

8. In a computer system having an enclosure for mounting an expansion card therein, the computer system comprising a mounting structure mounting the expansion card within the enclosure, the mounting structure comprising:
   a mounting bracket secured to the enclosure and configured to support the expansion card within the enclosure;
   a heat sink contacting a surface of an integrated circuit chip on the expansion card;
   an extension interconnecting the heat sink and the mounting bracket;
   a means for conducting heat from the heat sink to the mounting bracket and then dissipating the heat from the mounting bracket directly to an ambient atmosphere surrounding an exterior of the enclosure by a phase change medium within at least one heat pipe that contacts the heat sink and the mounting bracket of the mounting structure.

9. The computer system of claim 8, wherein the mounting structure is an assembled structure in which the heat sink is assembled with the extension and the mounting bracket.

10. The computer system of claim 9, wherein the heat sink is received within a frame defined by the extension.

11. The computer system of claim 10, further comprising a means for biasing the heat sink away from the frame.

12. The computer system of claim 8, wherein the means for conducting the heat from the heat sink to the mounting bracket and then dissipating the heat to the ambient atmosphere further comprises fins contacting the heat pipe and disposed on a side of the mounting bracket opposite the heat sink.

13. The computer system of claim 12, wherein the heat is transferred from the heat sink to the fins by the phase change medium within the at least one heat pipe.

14. A method of mounting an expansion card within a computer enclosure and for absorbing and conducting heat from a heat source on the expansion card to an ambient atmosphere surrounding the computer enclosure, the method comprising:
   providing a mounting structure;
   securing the expansion card to a mounting bracket of the mounting structure so that a heat sink extending from the mounting bracket contacts a surface of the heat source;
   securing the mounting bracket to the computer enclosure, the mounting bracket supporting the expansion card within the computer enclosure;
   conducting the heat from the heat sink to the mounting bracket; and
   dissipating the heat from the mounting bracket to the ambient atmosphere surrounding an exterior of the computer enclosure by a phase change medium within at least one heat pipe that contacts the heat sink and the mounting bracket of the mounting structure.

* * * * *